United States Patent [19]
Driller et al.

[11] Patent Number: 5,109,596
[45] Date of Patent: May 5, 1992

[54] ADAPTER ARRANGEMENT FOR ELECTRICALLY CONNECTING FLAT WIRE CARRIERS

[75] Inventors: Hubert Driller; Paul Mang, both of Schmitten, Fed. Rep. of Germany

[73] Assignee: Mania Gmbh & Co., Weilrod, Fed. Rep. of Germany

[21] Appl. No.: 433,833

[22] Filed: Nov. 13, 1989

[30] Foreign Application Priority Data

Nov. 12, 1988 [DE] Fed. Rep. of Germany ....... 3838413

[51] Int. Cl.⁵ ............... B23P 21/00; G01R 1/06
[52] U.S. Cl. ................... 29/705; 324/158 P
[58] Field of Search ............ 29/705, 884, 729; 324/158 P, 158 F, 72.5; 439/66, 91, 482

[56] References Cited

U.S. PATENT DOCUMENTS

| | | | |
|---|---|---|---|
| 4,099,120 | 7/1978 | Aksu | 324/72.5 X |
| 4,443,756 | 4/1984 | Lightbody et al. | 324/158 F X |
| 4,528,500 | 7/1985 | Lightbody et al. | 324/158 P X |
| 4,571,542 | 2/1986 | Arai | 324/158 P |
| 4,820,976 | 4/1989 | Brown | 324/158 P X |
| 4,926,117 | 5/1990 | Nevill | 324/158 P X |

FOREIGN PATENT DOCUMENTS 2156532A 10/1985 United Kingdom .

OTHER PUBLICATIONS

"Tester for Printed Circuit Board", vol. 7 No. 278 (P-242) [1423] Dec. 10, 1983.
"Conformal Multi-Probe Tester Assembly", IBM Technical Disclosure Bulletin, vol. 24, No. 7A, Dec. 1981.
"Test Probe Contact Grid Translator Board"; U. Renz; IBM Technical Disclosure Bulletin; vol. 21, No. 8, Jan. 1979; pp. 3235-3236.

Primary Examiner—Joseph M. Gorski
Assistant Examiner—Peter Dungba Vo
Attorney, Agent, or Firm—Wenderoth, Lind & Ponack

[57] ABSTRACT

A device for electrically connecting contact points of a test specimen (circuit board) to the electrical contact points of a testing device includes an adapter board having a plurality of contacts arranged on each side thereof. Cushion-like plugs made from an electrically conductive resilient material are provided on each of the contact points to equalize the height variations of the contact points of the test specimen. An adapter board is also provided made of a film-like material having inherent flexibility to equalize the height variations of the contact points of the test specimen. Furthermore, an adapter board is provided for cooperating with a grid made of an electrically insulated resilient material and having a plurality of plugs made from an electrically conductive resilient material extending therethrough.

2 Claims, 2 Drawing Sheets

ADAPTER ARRANGEMENT FOR ELECTRICALLY CONNECTING FLAT WIRE CARRIERS

BACKGROUND OF THE INVENTION

1. Field of the Invention

The present invention relates to a device for electrically connecting the contact points of a first flat wire carrier to the contact points of a second flat wire carrier. More particularly, the present invention relates to a device for electrically connecting the electric contact points of a first flat wire carrier having a first contact point pattern, such as a circuit board, to the corresponding electrical contact points of a second flat wire carrier having a second contact point pattern, such as an electronic testing device.

2. Description of the Related Art

Several adapter arrangements are known, often called "adapters" or "test jigs", including those arrangements described in "Patent Abstracts of Japan", Volume 7, No. 278 (P 242) (1423), Dec. 10, 1983, and in JP-A-58155374, 16.9.1983, and in IBM Technical Disclosure Bulletin, Volume 24, No. 7A, December 1981, pages 3342-3344. Furthermore, the contact arrangements are known as disclosed in GB-A-2156532, U.S. Pat. No. 4,099,120 and U.S. Pat. No. 4,443,756.

In addition, a contact arrangement is known consisting of a basic contact field or grid of the electronic testing device (not described herein in detail), attached to which is an active basic grid consisting of spring activated test pins arranged to correspond to the basic contact grid and contained in an insulated basic grid body, on which an adapter board is laid which is used to compensate for the locally raised connection densities of the test specimen (circuit board) and/or the sideways displacement (i.e. the displacement in the X and Y directions along the surface of the circuit board) between the regularly arranged contact points corresponding to the basic grid and to the not necessarily regularly arranged contact points corresponding to the test specimen. That is, the contact areas are arranged on one side of the adapter board to correspond to the basic grid of the testing device, and the contact areas on the other side of the adapter board are arranged to correspond to the arrangement of the contact points of the test specimen. Conductor tracts and plated through holes are provided in the adapter board to electrically connect corresponding contact areas on each side of the adapter board.

Vertically arranged, longitudinal spring activated test pins are provided on the side of the adapter board having contact areas arranged to correspond to the circuit board to be tested. These test pins, which establish contact with the surface of the test specimen, are pressed by a suitable pressure attachment.

The basic structure of the adapter boards described above correspond to the conventional printed circuit boards (PCB's). That is, the adapter boards described above are essentially rigid or semi-rigid boards made from an insulating material and, as indicated above, have electrically conducted areas on their top and bottom surfaces.

The above described arrangement, which is well known and available in the market, has a drawback in that a large number of spring activated test pins are required. These spring activated test pins entail a considerable investment on the part of the user of the test equipment. Furthermore, due to the necessary mechanical strength of the test pins, limits are imposed on their miniaturization, therefore establishing limitations as to the test pin density of the adapter board.

The above cited drawback to the conventional adapter board can be partly solved by making the contact between the side of the adapter board with contact areas corresponding to those of the test specimen and the test specimen itself by means of a so-called vertical conductor board. The vertical conductor board consists in principle of a panel of elastic insulating material containing finely distributed contact wires running vertically and parallel, and therefore insulated from one another and protruding from the surface of the vertical conductor board on the top and bottom sides. Although it is relatively easy to connect the adapter board and the test specimen using these vertical conductor boards, their manufacture is exceptionally expensive.

SUMMARY OF THE INVENTION

It is an object of the present invention to provide a novel adapter board arrangement capable of overcoming the above-cited drawbacks of the conventional adapter board arrangement.

It is a further object of the present invention to provide an adapter board arrangement capable of compensating for varying heights of the contact points of the test specimen by using at least one of an electrically conductive resilient material and a flexible film-like material.

According to a first embodiment of the present invention, an adapter board is provided in which a plurality of cushion-like plugs from an electrically conductive and resilient elastomer is provided on the surface thereof such that each cushion-like plug is permanently attached to the contact surface of the adapter board. That is, on each contact surface of the adapter board, there is provided a separate, individual "spring cushion", made from a resilient elastomer material.

According to another embodiment of the present invention, an adapter board is provided, having metal contact areas on each face thereof, in the form of a thin, flexible film, which, due to its flexibility, compensates for the vertical variations in contact height of the contact points of the test specimen. That is, equalization between the varying contact heights of the test specimen is achieved by the flexibility of the adapter board itself. The flexible adapter board is provided for cooperating with an active grid. The active grid is made of an insulated material, with longitudinally extending spring test pins arranged in parallel holes corresponding to the contact points of the test device. The flexible adapter board is arranged between the active grid and the test specimen. The active basic grid having test spring contacts therein increases the contact reliability of the arrangement, because a more even contact pressure is achieved at each contact point.

In yet another embodiment of the present invention, an adapter board is provided for cooperating with an active grid, in which the active grid is made of a resilient insulating elastomer having a plurality of plugs made from an electrically conductive resilient elastomer extending therethrough.

The actual electronic testing device, which is not described in detail herein, is usually provided with various measurement circuits to perform routine testing of the test specimen. While one particular form of such prior art electronic testing device is described in applicants U.S. Pat. No. 4,674,006, other such electronic testing devices for printed circuit boards ("bare board testers") are well known in the art.

BRIEF DESCRIPTION OF THE DRAWINGS

The foregoing and other features, objects and advantages of the present invention will become more apparent upon a reading of the following description in connection with the accompanying drawings in which.

Figure 1:
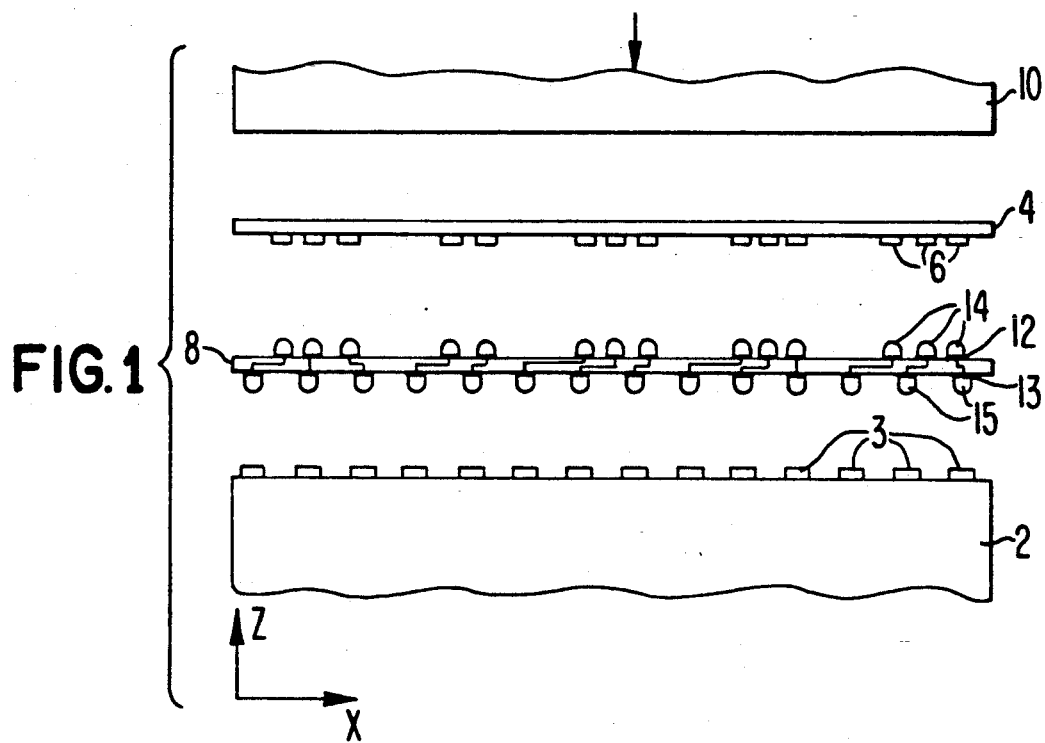
FIG. 1 is an exploded illustration of a contact arrangement of the present invention in which a flat wire carrier having contact areas on one side is to be tested.
Figure 3:
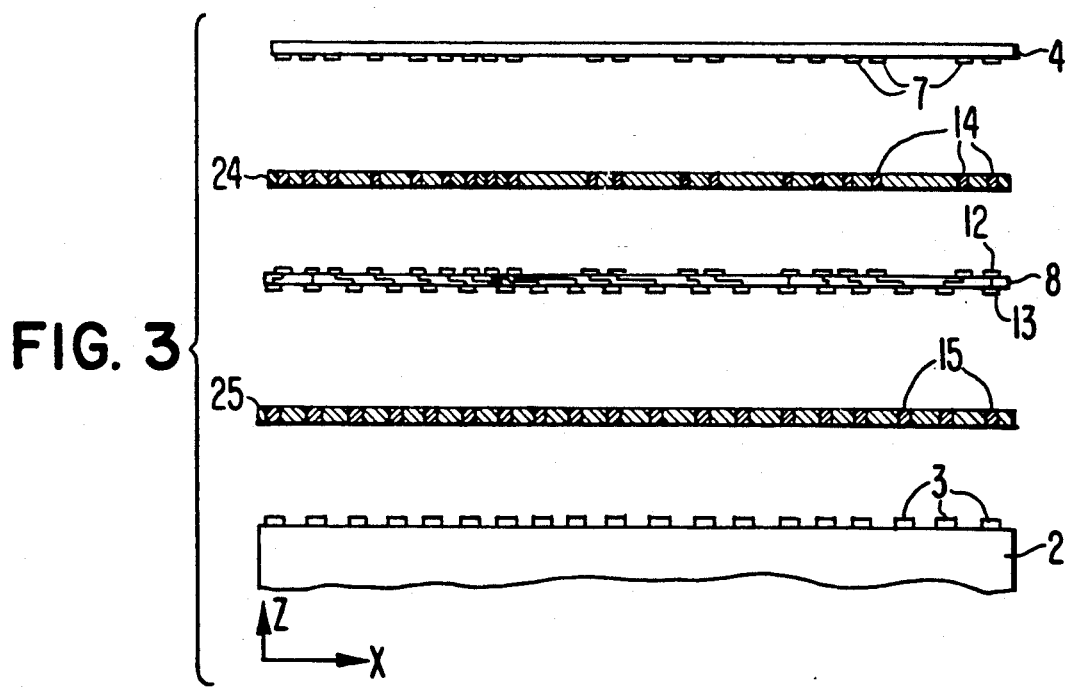
FIG. 3 is an exploded illustration, partly in sections, of the contact arrangement of the present invention in which plugs made from an electrically conductive elastomer are arranged separately in a contact mat.
Figure 2:
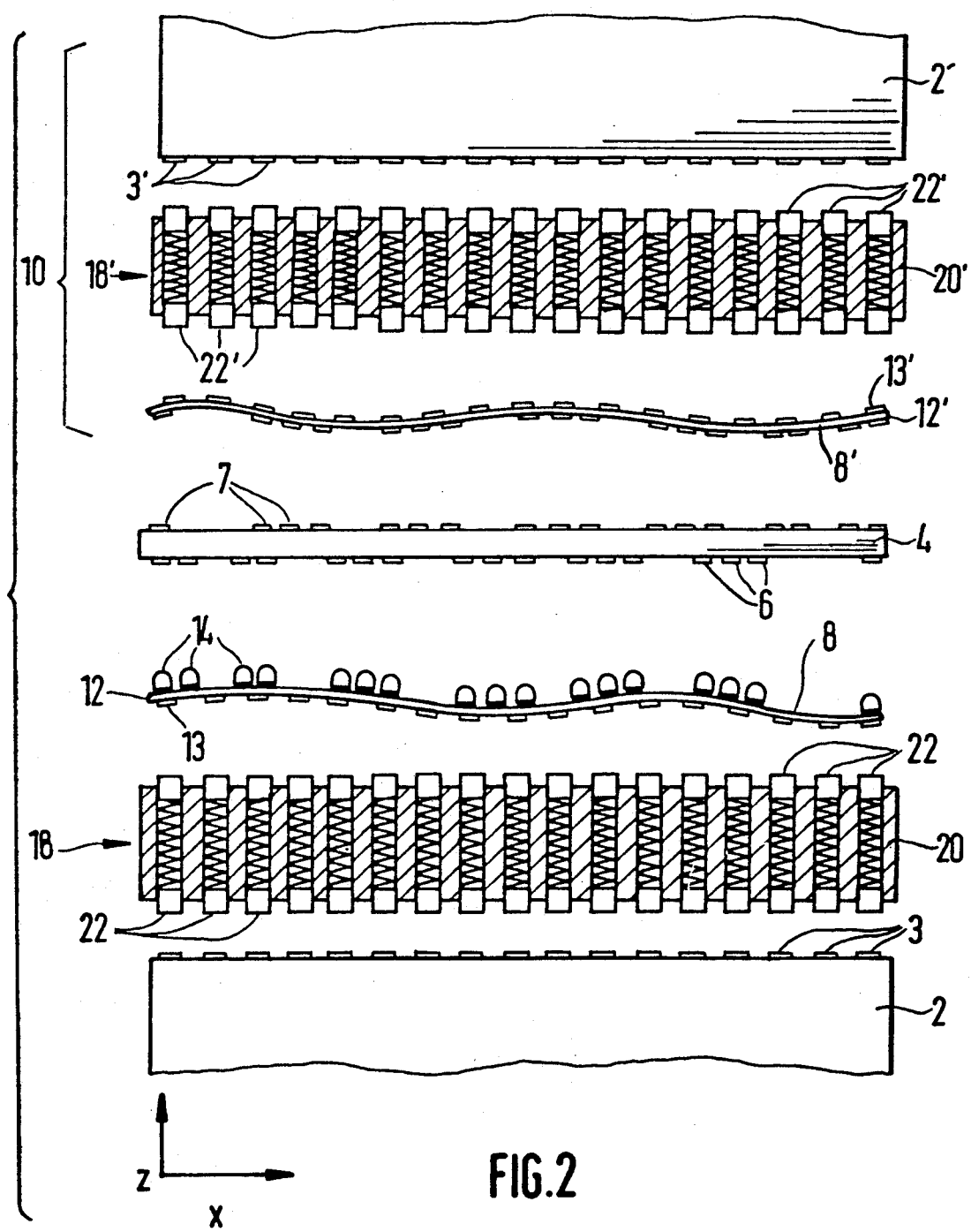
FIG. 2 is an exploded illustration of a contact arrangement of the present invention in which a flat wire carrier with contact areas on both sides thereof is to be tested.

It is noted that the illustrated elements are 3-dimensional structures, but that the illustrations of FIGS. 1-3 show only the X-Z plane, i.e. the drawing plane, and the third Y dimension of the coordinates runs vertical to the drawing plane and is not illustrated.

DESCRIPTION OF THE PREFERRED EMBODIMENTS

Referring now to FIG. 1, reference number 2 denotes a conventional circuit board testing device with a regular basic grid 3 consisting of contact points for connecting contacts or contact points 6, not grid-linked, of a test specimen 4, using the adapter arrangement of the present invention described in the following. The contact surfaces or connection points 6 on the wiring carrier 4 (circuit board, ceramic substrate etc.) can be arranged in any pattern, i.e., they may be partly linked to a grid and partly locally compressed on the circuit board 4 to be tested, often with many hundreds or even thousands of connection points 6 per circuit board/wiring carrier 4. In order to connect these irregularly arranged connection points with the regularly arranged contacts of the basic grid 3 of the test device 2, the adapter board 8 shown in FIG. 1 is provided. The adapter board 8 is manufactured individually, depending on the wire carrier to be tested, by the usual circuit board techniques, as a printed circuit with contact areas 12 and 13 on both sides of the adapter board. The contact areas 13 facing the testing device 2 are arranged to correspond precisely to the basic grid 3 of the testing device, while the contact areas 12 on the side of the adapter board 8 facing the test specimen ar distributed to correspond to the arrangement of the connection points 6 on the test specimen 4. Each contact area 12 is linked to an allocated contact contact area 13 on the other side of the adapter board 8 by the usual circuit board techniques, using conductor tracks (not shown in the drawing) on one of the two surfaces of the adapter board, and plated through holes, i.e. conductive areas in the adapter board running in the direction of the Z-axis, vertical to the adapter board. Accordingly, a test current from the testing device can flow from one contact of the basic grid 3 to the related contact area 13 on one side of the adapter board, on to the other contact are 12 on the other side of the adapter board, and from there to the connection point 6 on the test specimen 4 which is to be tested.

To ensure even contact pressure, and to therefore ensure correct connection of the test specimen test contact areas of the contact arrangement, as shown in FIG. 1, a plug 14 or 15 made from an electrically conductive elastomer is arranged on each contact area 12 or 13 of the adapter board 8. These plugs are elastically compressible, so that they ensure both the necessary contact pressure between the test specimen 4 and the basic grid 3 and the equalization of any variations in contact height which may unintentionally arise from inaccuracies in production. The necessary pressure between the test specimen 4, the adapter board 8 with plugs 14 and 15 on all contact areas 12, 13 and the basic grid 3 of the testing device is ensured using a semi-rigid pressure plate 10, which may be part of a hydraulic press or similar.

In FIG. 1, the adapter board 8 is an essentially semi-rigid circuit board, while in the basically similar illustration of FIG. 2, the corresponding adapter boards 8,8' are thin and film-like and are therefore shown as a slight wave, i.e. the adapter board/film 8' shown in the top half of FIG. 2, because of its inherent flexibility, is in a position to equalize any contact height variations in the Z direction on the test specimen 4. Where necessary, a so-called active basic grid 18', which will be described in more detail below, ensures the necessary contact height equalization between the contact areas 13' of the adapter film 8' and the second (top) testing device 2'.

FIG. 2 shows a principle illustration of the two-sided testing of a test specimen 4. In the bottom half, a slightly modified adapter technique is being used on the adapter board/film 8, leaning more towards the technique used in FIG. 1. Where the same elements are present in both FIG. 1 and FIG. 2, the same reference numbers are used, but those used in the top half of FIG. 2 each are provided with a prime.

The adapter film 8 in the bottom half of FIG. 2 has plugs 14 made from electrically conductive elastomer on the respective contact areas 12 on one side only, the side facing the test specimen 4. These plugs 14, in addition to the active basic grid 18, ensure particularly good contact height equalization in the direction of the Z axis.

Apart from one feature which will be described later, the active basic grid is a known component placed on the immobile contacts of the basic grid 3 of the testing device 2 to prepare from the rigid basic grid 3 an active basic grid, with test contacts 22, which is "actively" springy in the Z direction. The active basic grids 18 and 18' may, for example, be constructed in such a way that an electrically non-conductive basic body 20, 20' is provided with a number of drill holes running in the Z direction and parallel with one another, corresponding to the distribution of the basic grid 3, inserting test pin springs of the appropriate length into these drill holes. The tips of these pin springs facing the adapter boards 8 or 8' then correspond to the test contacts 22 or 22' of the active basic grid 18 or 18'.

The active basic grid 18 or 18' is constructed in a special way so that the basic grid body 20 or 20' is manufactured from an inherently elastic material, for example an electrically non-conductive elastomer. If the elasticity of the basic grid body corresponds approximately to the elasticity of the contacts 22, the basic grid body 20 contributes to supporting the entire surface of the test specimen or wiring carrier while the contact pressure is being applied, i.e., not only in the area of the contact surfaces. This is especially advantageous when the test specimen 4 has very irregularly arranged contact points 6 and 7, which may be present in large numbers. If there were no such support over the entire surface of the test specimen 4, the local concentration of pressure on connection points 6 and 7 of the test specimen 4 could lead to the damage or tearing of the test specimen 4 or the conductor tracks provided thereon.

The number 10 in the top half of FIG. 2 is intended to denote that the top arrangement, consisting of testing device 2', active basic grid 18' and adapter board 8', acts in the same way as the pressure plate 10 in FIG. 1. If, therefore, a circuit board 4 is to be tested on both sides simultaneously, the basic grid 3' of the testing device 2' should be movably supported together with the active basic grid 18' and the adapter board/film 8' in the Z direction, in the same way as in the case of the pressure plate 10, with the aid of a hydraulic device, not shown in detail.

FIG. 3 shows a modification of the contact arrangement shown in FIGS. 1 and 2. The plugs 14 and 15 made from the electrically conductive elastomer material and allocated to contact surfaces 12 and 13 are not permanently connected to the contact surface of the adapter board but are isolated therefrom in separate contact mats 24 and 25 manufactured from an electrically insulating elastomer material.

For the purpose of the present adapter board technique, a silicone rubber containing finely distributed metal particles is preferred as the electrically conductive resilient elastomer material of the plugs 14, 15 shown in FIGS. 1-3. However, other conductive resilient elastomers such as carbon-enriched polyurethanes are also known in the state of the art and can be used here.

The invention adapter board design can equalize "local" thickness variations on the test specimen up to 200 μm (i.e. between neighboring contact points) and "global" variations of up to 500 μm, i.e. over sections of around 20-30 cm on the circuit board.

One very important benefit in the present invention is that the resilient flexibility conventionally provided by spring activated test pins and/or an active basic grid to equalize thickness and contact height variations is moved to the adapter board, and achieved either by the attached plugs made from a conductive elastomer material or by the inherent flexibility of the film-type adapter board. This dispenses with the need for test pins, i.e., a "pinless" adapter is provided.

The manufacture of the adapter boards, which varies depending on the specimen to be tested (which may, for example, be multilayer or double sided), is performed by the test equipment user, usually a circuit board manufacturer, using the techniques normally applied in the manufacture of conventional circuit boards. The necessary photo masks and/or drilling programs, etc., can be prepared in accordance with the state of the art, using electronic data processing (CAD techniques and NC drilling machines). The attachment of the plugs made from conductive elastomer to the contact areas of the adapter board manufactured by the usual circuit board techniques or the introduction of the elastomer mat made from insulating material into the drill holes also occurs by means of known techniques, for example, during screen printing or using suitable spray techniques, applying the elastomer while still in liquid form.

While several embodiments of the present invention have been shown and described in detail, it is understood that changes and modification may be made thereto without departing from the scope of the invention.

We claim:

1. A device for electrically connecting electrical contact points of a flat wire carrier to respective electrical contact points of a test grid of an electronic testing device, where the electrical contact points of the flat wire carrier are arranged in a first pattern which is different than a second pattern of the contact points of the test grid, said device comprising:

an adapter board having first and second planar faces;

a plurality of first contacts disposed on said first planar face of said adapter board in the first pattern;

a plurality of second contacts disposed on said second planar face of said adapter board in the second pattern;

conductive means, extending through said adapter board, for electrically connecting each of said plurality of first contacts with one of said plurality of second contacts; and, compensating means associated with said adapter board for compensating for varying heights of the contact points of at least one of the flat wire carrier and the test grid, said compensating means including at least one of an electrically conductive elastomer material and a flexible film-like material;

wherein said compensating means includes a first grid having first and second planar faces, for establishing electrical contact with at least one of said plurality of first contacts disposed on said first planar face of said adapter board, said first grid made from an electrically insulated resilient material and having a plurality of plugs made from an electrically conductive elastomer material extending therethrough from the first planar face to the second planar face in said first pattern.

2. A device as recited in claim 1, where said compensating means further includes:

a second grid, having first and second planar faces, for establishing electrical contact with at least one of said plurality of second contacts disposed on said second planar face of said adapter board, said second grid made from an electrically insulating resilient material and having a plurality of plugs made from an electrically conductive elastomer material extending therethrough from the first planar face to the second planar face in said second pattern.

* * * * *